(12) United States Patent
Hsu et al.

(10) Patent No.: US 6,512,683 B2
(45) Date of Patent: Jan. 28, 2003

(54) SYSTEM AND METHOD FOR INCREASING THE SPEED OF MEMORIES

(75) Inventors: Louis L. Hsu, Fishkill, NY (US); Li-Kong Wang, Montvale, NJ (US); Toshiaki K. Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 09/827,071

(22) Filed: Apr. 5, 2001

(65) Prior Publication Data

US 2002/0147883 A1 Oct. 10, 2002

(51) Int. Cl.⁷ .............................. G11C 15/00; G11C 8/00
(52) U.S. Cl. ...................... 365/49; 365/233; 365/189.04
(58) Field of Search ..................... 365/49, 233, 189.01, 365/189.04, 230.02, 230.03

(56) References Cited

U.S. PATENT DOCUMENTS 5,173,878 A * 12/1992 Sakui et al. ................. 365/193
5,875,452 A * 2/1999 Katayama et al. .......... 365/233
6,249,476 B1 * 6/2001 Yamazaki et al. ..... 365/230.03

OTHER PUBLICATIONS

Yasuhiro Agata, et al. "An 8ns Random Cycle Embedded RAM Macro with Dual–Port Interleaved DRAM Architecture ($D^2RAM$)", 2000 IEEE International Solid–State Circuits Conference, pp. 1–8.

* cited by examiner

*Primary Examiner*—Richard Elms
*Assistant Examiner*—Anh Phung
(74) *Attorney, Agent, or Firm*—Scully, Scott, Murphy & Presser; Robert M. Trepp, Esq.

(57) ABSTRACT

The speed of memories is increased by trading memory density (or area) for speed (or cycle time). An n by n memory array is used to reduce the memory cycle time by 1/n. For example, if an existing memory cycle time is 6 ns, in order to achieve a 3ns (or n=2) cycle time, a 2 by 2 memory array is used. Or, in order to achieve a 1ns cycle time (or n=6), then a 6 by 6 memory array is used.

32 Claims, 5 Drawing Sheets

1/2 of the cycle time

Speed Doubled By Write Interleaving

Speed Doubled By Write Interleaving

Figure 1

Speed Doubled By Read Interleaving

Figure 2

(A) No Latency (B) 1/2 Cycle Time Latency

SYSTEM AND METHOD FOR INCREASING THE SPEED OF MEMORIES

FIELD OF THE INVENTION

The present invention relates generally to memory circuits, and more particularly pertains to a system and method for increasing the speed of semiconductor memories and memory arrays.

BACKGROUND OF THE INVENTION

Technological advances have resulted in a continuous increase in the density of semiconductor memory chips, e.g. DRAM, SRAM, Flash, NVRAM, FRAM, etc. For example, improvements on yield control, integration schemes and scaling of the devices have significantly reduced the cost per bit of these memory chips over the years. However, the speed gap between the speed of the memory and the speed of the microprocessor has constantly become wider. Several techniques to enhance memory speed have been proposed recently, such as using an embedded design with a wide data bandwidth, or a special high-speed memory Rambus-like interface protocol. Nevertheless, the speed of memory can hardly keep up with the ever-increasing demands of microprocessors.

It would be highly desirable to provide a method for increasing the speed of memories and memory arrays by reducing the random cycle time thereof.

SUMMARY OF THE INVENTION

It is an object of the present invention to provide a system and method for increasing the speed of memories of any type such as semiconductor memories, magnetic memories and optical memories, and is particularly applicable to high speed semiconductor memories and memory arrays, such as high speed DRAM caches.

It is a further object of the subject invention to provide a system and method for increasing the speed of memory arrays, particularly by decreasing the random cycle time thereof.

As mentioned earlier, the packing densities of memory are generally quite high. The cell size of DRAM (dynamic random access memory) has decreased to less than 0.2 um$^2$ by using a deep-trench or high-K material with a stacked structure as the memory capacitor.

The present invention trades memory density (or area) for memory speed (or cycle time). The subject invention duplicates a memory with an array of n$^2$ memories in order to reduce the random cycle time thereof by 1/n. For example, if an existing memory cycle time is 6 ns, in order to achieve a 3 ns (or n=2) cycle time, an array of 4 memories is used, or in order to achieve a 1.5 ns (or n=4) cycle time, an array of 16 memories is used, or in order to achieve a 1 ns cycle time (or n=6), then an array of 36 memories is used, with n being extendable to any number depending upon the desired speed and application.

Advantageously, the system and method of the present invention can increase the speed or cycle time of almost any kind of memory including semiconductor, magnetic and optical memories, and read-only and write-only memories.

BRIEF DESCRIPTION OF THE DRAWINGS

The foregoing objects and advantages of the present invention for a method and circuit for increasing the speed of memories may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
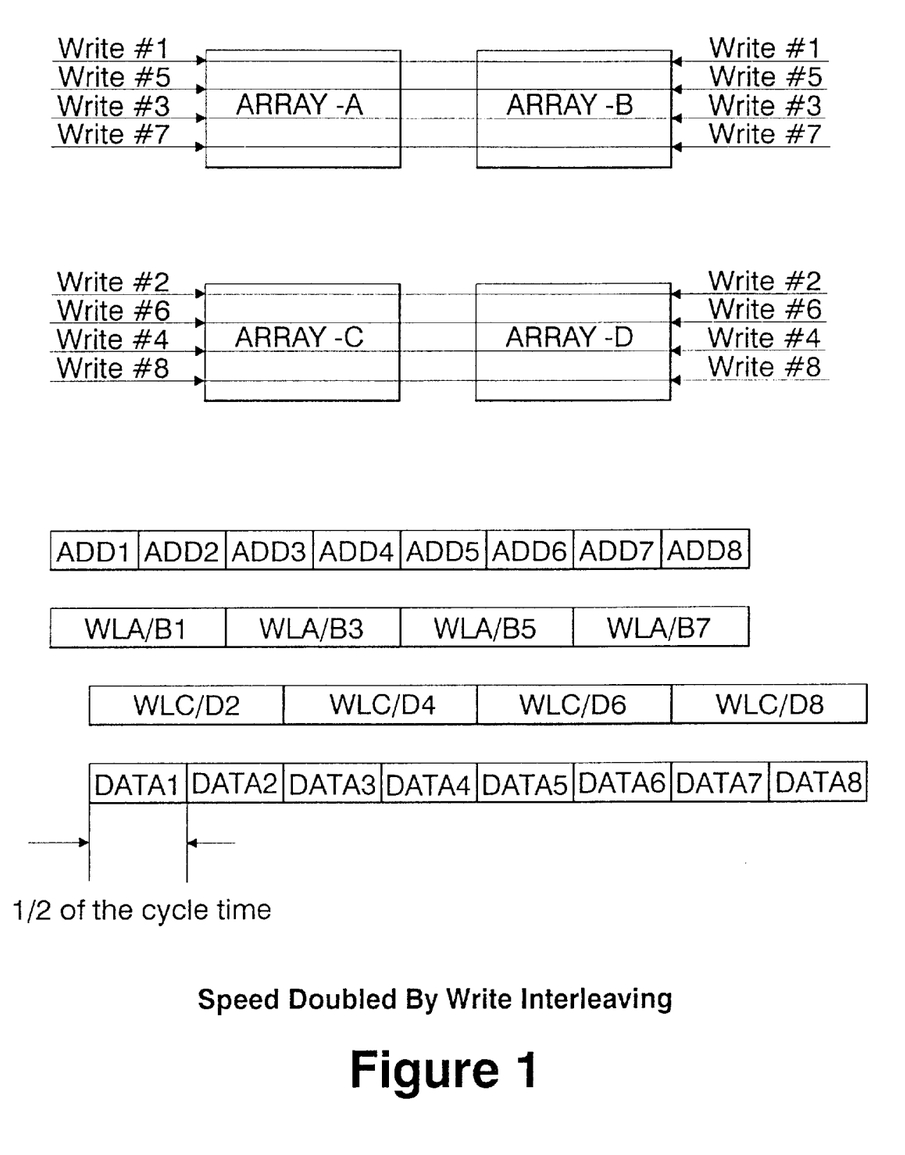
FIG. 1 illustrates a memory array system which doubles the memory write speed by performing interleaved write operations in accordance with the principles of the present invention, and the timing diagrams at the bottom of FIG. 1 illustrate write timing operations of the memory array system.

FIG. 1 illustrates a memory array system which doubles the memory write speed by performing write interleaved write operations in accordance with the principles of the present invention, and the bottom of FIG. 1 illustrates write timing diagrams of write operations of the memory array system. As shown in FIG. 1, four identical memory array macros are used, ARRAY-A, ARRAY-B, ARRAY-C and ARRAY-D. Externally, these four memory array macros are treated as a single memory.

According to the principles of the present invention, a simple continuous interleaved write operation is performed. Note that in the Figures, Write #1, #2, etc, indicates the order of the write operation, not the wordline address number, and similarly for Read #1, #2, etc. Pursuant to the interleaved write operation, when data is to be written into the memory array in a first Write #1 operation, the memory controller (not shown) writes the data into the same wordline having the same wordline address in a Write #1 operation in both of the ARRAY-A and ARRAY-B macros simultaneously. For an exemplary cycle time of 6 ns, after 3 ns or ½ the cycle time of each memory macro in the memory array, a second write command Write #2 is issued to write the data simultaneously into a second wordline having the same wordline address in both of the ARRAY-C and ARRAY-D macros.

In the next 3 ns, a third wordline having the same wordline address of both ARRAY-A and ARRAY-B is activated simultaneously for writing in a Write #3 operation. Concurrently, the data are written into cells having the same wordline address in the ARRAY-A and ARRAY-B macros. Using this interleaved technique, the ARRAY-A and ARRAY-B macros are loaded with the same data, and the ARRAY-C and ARRAY-D macros are loaded with the same data. However, totally only ½ of the wordlines in each memory array macro are selected and filled. This is because, when wordline addresses of ARRAY-A and ARRAY-B are being used, the same wordline addresses of ARRAY-C and ARRAY-D are not selected and used.

Write speed doubling is achieved by first writing data into the ARRAY-A,B macros and then into ARRAY-C,D macros in an interleaved manner, since these two groups of the memory array can be operated independently of each other. As a result, the incoming data rate (or write speed) can be doubled, and thus the cycle time appears to be half to the outside world.

The bottom of FIG. 1 illustrates write timing diagrams of write operations of the memory array system of FIG. 1, wherein ADD1 means memory address 1 of operation Write #1, etc., WLA/B1 means wordlines in both ARRAY A and B macros, etc., DATA 1 means that operation Write # 1 is being performed on data being written.

Figure 2:
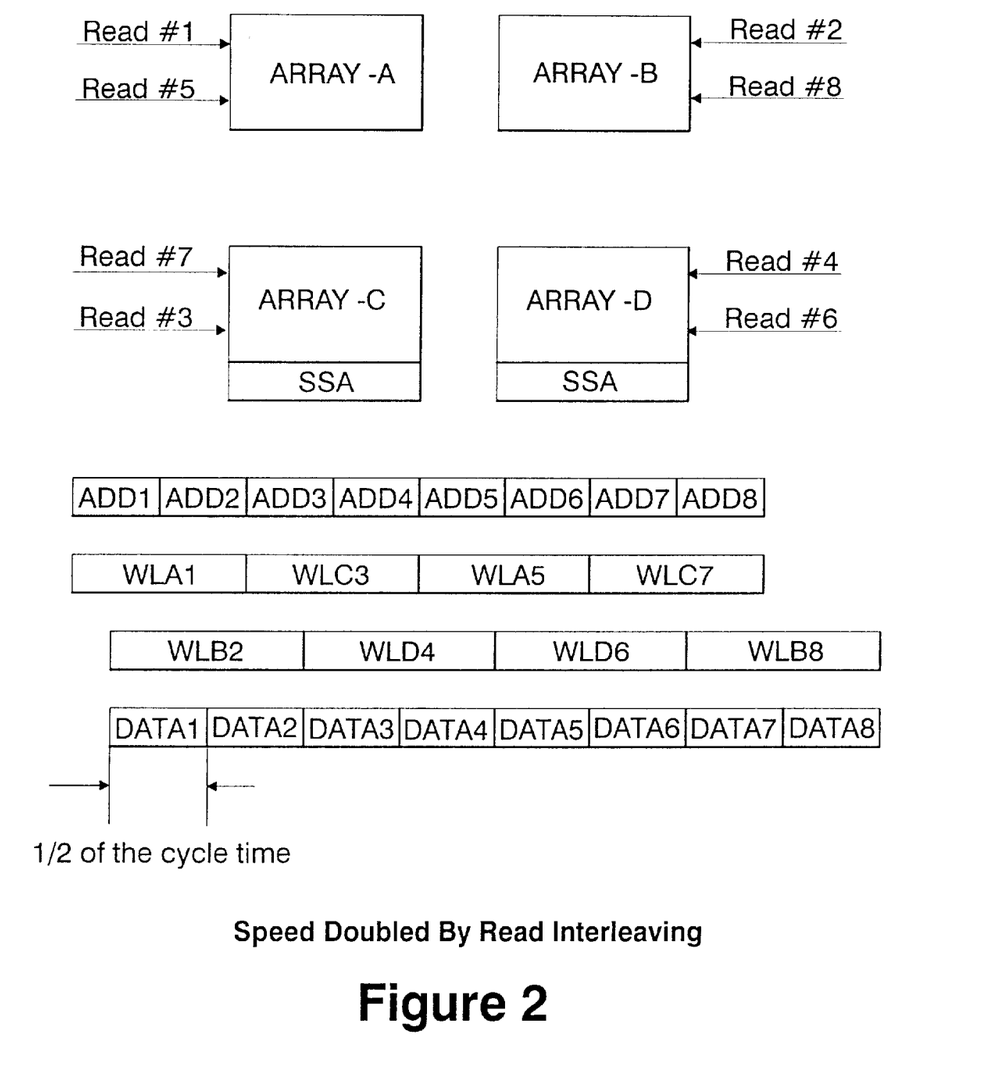
FIG. 2 illustrates a memory array system which doubles the memory read speed by performing interleaved read operations in accordance with the principles of the subject invention, and the timing diagrams at the bottom of FIG. 2 illustrate read timing operations of the memory array system.

With the ARRAY-A and ARRAY-B macros storing respectively identical data patterns, and the ARRAY-B and ARRAY-D macros storing respectively identical data patterns, an interleaved read operation is enabled. After the memory array is written and filled with data, FIG. 2 illustrates how continuous interleaved read operations can be performed. FIG. 2 illustrates a memory array system which doubles the memory read speed by performing interleaved read operations in accordance with the principles of the invention, and the timing diagrams at the bottom of FIG. 2 illustrate read timing operations of the memory array.

For high density integration ARRAY-A and ARRAY-C share one secondary sense amplifier (SSA), while ARRAY-B and ARRAY-D share another separate SSA. For data to be read in ½ cycle, the two SSAs and the respective arrays must be used alternately.

An example, if data stored in a first wordline in both ARRAY-A and B macros is needed by the CPU, only ARRAY-A is activated for a Read #1 operation. After a half memory cycle time of 3 ns later, data stored in a second wordline of both ARRAY A and B macros is needed by the CPU, and now only ARRAY-B is activated for this Read #2 operation. It should be understood that, during this 3 ns period, wordlines having different row addresses of both ARRAY-A and ARRAY B are activated. Since the data stored in ARRAY-A and ARRAY B are identical, either array could be activated for data retrieval if data for the selected wordline is stored in these two macros. After another 3 , a third wordline of ARRAY-C is accessed in a Read #3 operation, and then a fourth wordline of ARRAY-D is accessed. As a result of the interleaved data read operations, data is read out of the memory array in ½ of the memory macro cycle time. Thus the read speed is effectively doubled.

Figure 3:
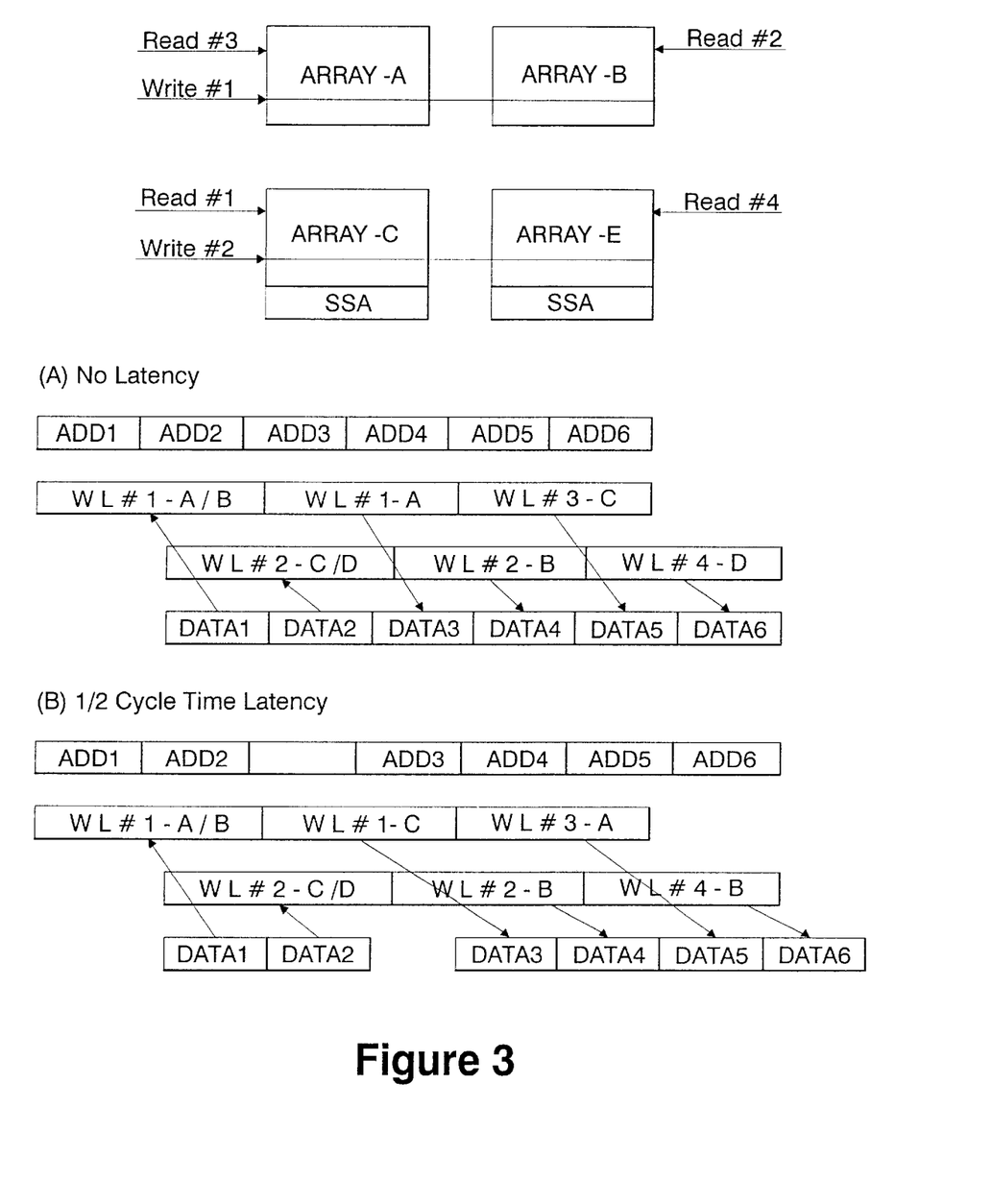
FIG. 3 illustrates a worst case situation of a ½ cycle latency delay between write and read operations.

A worst case situation can exist of a ½ cycle delay latency between write and read operations. As shown in FIG. 3, a wordline having the first set of same wordline addresses in the ARRAY-A and B macros is activated and written with a row of data in a Write #1 operation. After 3 ns, a wordline having the second set of same wordline addresses of ARRAY-C and D is activated for a data write operation Write #2. At this moment, if data stored in wordlines in ARRAY-C and ARRAY-D must be retrieved, then there will be a delay of ½ cycle time before this data can be retrieved in a read operation, as illustrated by the waveforms of FIG. 3 (B). Sometimes a simple rescheduling of operations can avoid such a delay. For example, if a wordline in ARRAY-A or B is read first, then this ½ cycle latency delay can be eliminated, as illustrated by the waveforms of FIG. 3(A).

This can be performed in a small TAG cache where addresses of valid wordlines storing written data in the cache are stored. An incoming address is compared with the addresses stored in the TAG, and then a decision is made on scheduling to minimize any latency delay.

(2) Example of Speed Quadrupling

Figure 4:
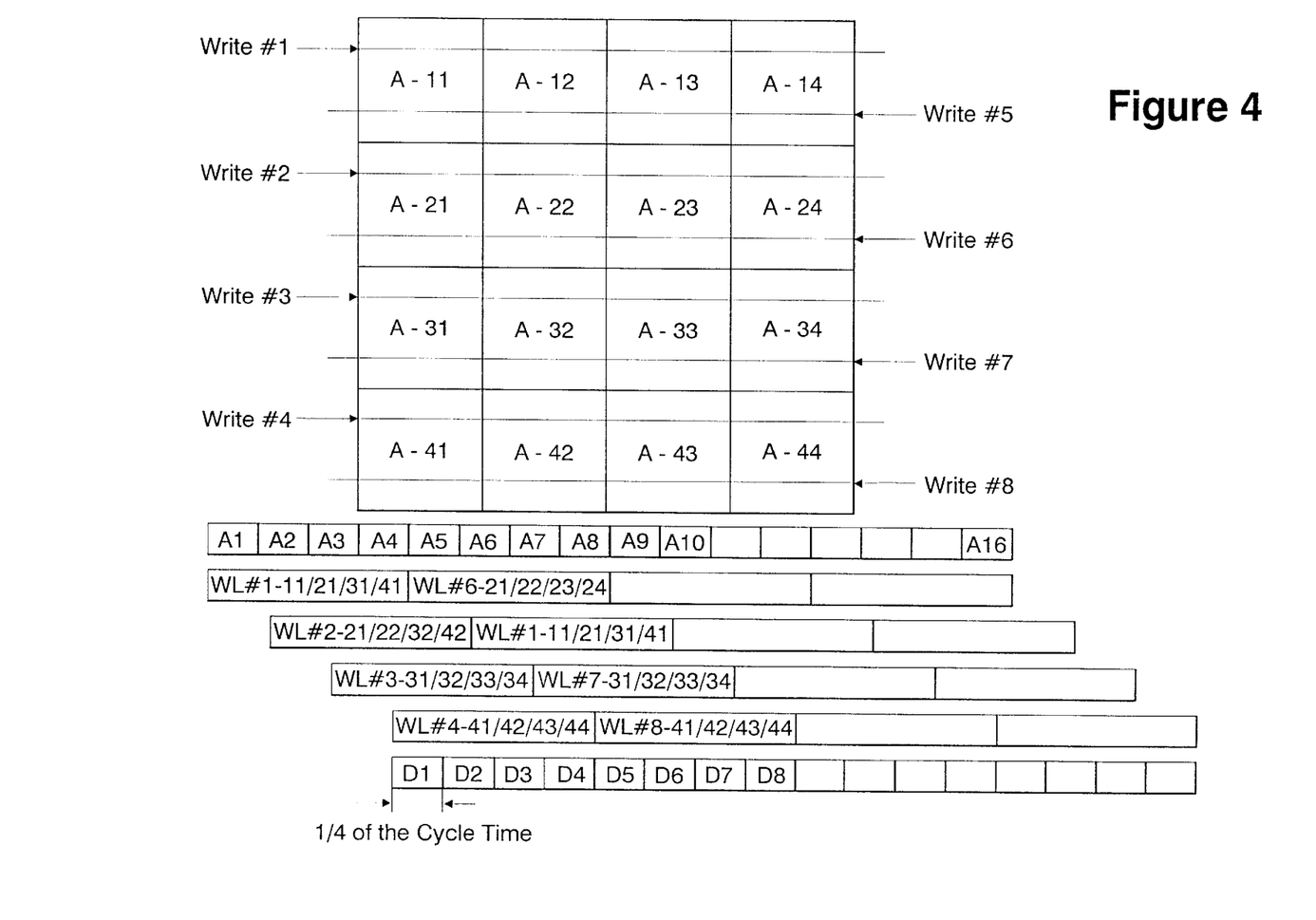
FIG. 4 illustrates a memory array system which quadruples the memory write speed by performing interleaved write operations in accordance with the principles of the present invention, and the timing diagrams at the bottom of FIG. 4 illustrate write timing operations of the memory array system.

This concept of speed improvement is extendable to any number n. If 16 identical memory array macros are used, then the read/write speed is enhanced by 4×. FIG. 4 illustrates a memory array system which quadruples the memory write speed by performing interleaved write operations in accordance with the principles of the present invention. Timing diagrams at the bottom of FIG. 4 illustrate write timing operations of the memory array system. In a Write operation #1, a wordline having the first set of same wordline addresses in the first four array macros, ARRAY- 11, ARRAY-12, ARRAY-13 and ARRAY-14 is selected and the same data is written into all four macros simultaneously. After ¼ of the memory cycle time or 1.5 ns, a wordline having the second set of same wordline addresses in the second four array macros, i.e. ARRAY-21, ARRAY-22, ARRAY-23 and ARRAY-24 is activated and data is simultaneously loaded into all four macros in the same manner, etc. Each row of macros is activated after each ¼ of memory cycle time, and data is simultaneously loaded to all four macros at the different sets of same addresses. As a result, the data write rate is quadrupled.

Figure 5:
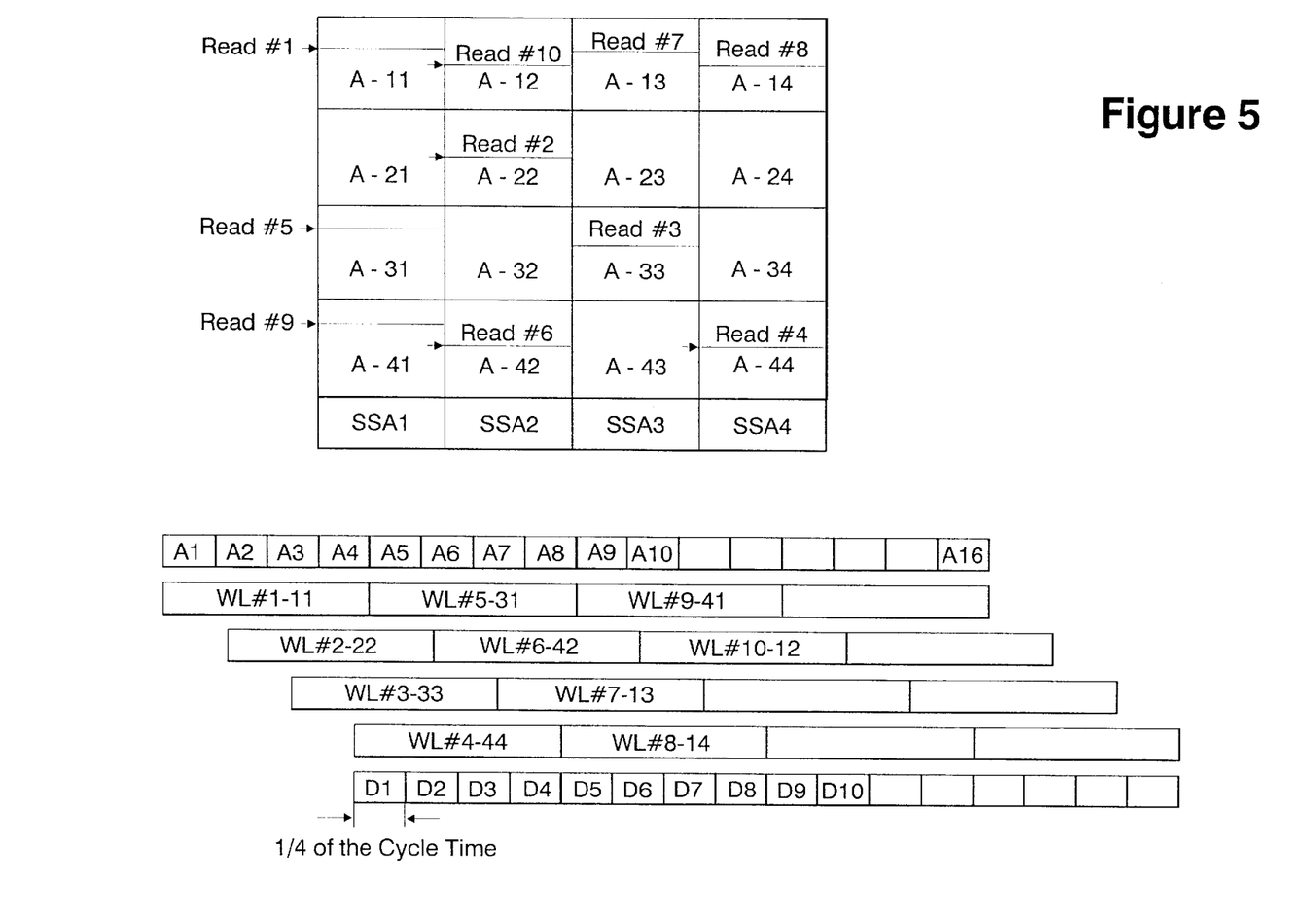
FIG. 5 illustrates a memory array system which quadruples the memory read speed by performing interleaved read operations in accordance with the principles of the invention, and the timing diagrams at the bottom of FIG. 5 illustrate read timing operations of the memory array system.

Each of four identical macros in a row is used to enable a read interleaved operation similar to the one described above. FIG. 5 illustrates a memory array system which quadruples the memory read speed by performing interleaved read operations in accordance with the principles of the present invention, and the timing diagrams at the bottom of FIG. 5 illustrate read timing operations of the memory array. For each read operation, only one wordline having the same wordline address of the four horizontal macros is activated.

After data is loaded into all 16 macros, each 4 macros located in a vertical column, such as A-11, A-21, A-31, A-41, are treated as a single array for read operations. Within these four macros, for each clock cycle only one of the macros can be accessed for a read operation. Since it takes a full clock cycle to send the data out, and only one secondary sense amplifier SSA1 is used for all 4 macros, to achieve a quadrupled read speed, a different set of four macros must be accessed every ¼ clock cycle.

For example, if a first read occurs in A-11, then a second read operation can be anywhere other than inthemacros A-21, A-31, A-41. Similarly, if a second read occurs in A-12, it can take place ¼ clock cycle later than the first read, and its data can be transferred out via SSA2. The third read can take place in the third group of 4 macros such as A-13, A-23, A-33, A-43, or in the fourth group of 4 macros A-14, A-24, A-34, A-44. This interleaved read in the column direction allows ¼ cycle seamless read operations. The operation can be performed by a memory controller with at least one scheduler to schedule read and write operations.

With this approach, the ultimate data rate is determined by the transistor speed of each memory macro, not by the memory architecture. A memory speed in the THz ($10^{12}$) or hundreds of GHz range is attainable. DRAM memories, since the cell size is much smaller than that of SRAM memories, are ideal candidates to trade size for speed and thus to form an ultra-high speed DRAM cache. For example, one can use a DRAM memory with a micro-cell structure to achieve approximately a 6 ns-cycle time. With the present invention, a 4× memory array can achieve a 3 ns cycle, and a 16× memory can achieve a 1.5 ns cycle time, which is faster than most existing high-speed SRAM memories. As another example, it is feasible to form a 4 M eDRAM (16 M size) L1 cache with 1.5 ns cycle time for an advanced high-speed CPU. The present invention is particularly suited to applications requiring a small-sized, high-speed cache.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

What is claimed is:

1. A memory array of memory macros for reducing the memory cycle time. of a memory macro by 1/n comprising:
   an n by n memory array of memory macros having n macros arranged in columns and n macros arranged in rows;
   while reading data from a wordline of the memory array, data is read from only one wordline from one macro of a column of macros, and after each 1/n of cycle time, data is read from only one another wordline of another macro of another column of macros.

2. The memory array of claim 1, wherein each macro comprises a memory selected from the group of semiconductor, magnetic and optical memories.

3. The semiconductor memory array of in claim 1, wherein each macro comprises a memory selected from the group of DRAM, SRAM, Flash, NVRAM, and FRAM memories.

4. The memory array of claim 1, as a high-speed cache memory for a central processor unit.

5. The memory array of claim 1, as a high-speed cache memory for an embedded memory application.

6. The memory array of claim 1, further comprising a TAG memory to store the addresses of wordlines written with valid data in the memory array, wherein an incoming address is compared with the addresses stored in the TAG memory to schedule memory operations to minimize latency delays.

7. The memory of claim 1, further comprising a memory controller including at least one scheduler to schedule read operations.

8. The memory of claim 1, wherein while writing data to a wordline having a wordline address, all the wordlines having the same wordline of address in macros in the same row are written with the same data, and data is written in an interleaved manner in which, after each 1/n of memory cycle time, data is written into another row of macros in another row of wordlines having the same wordline address.

9. A memory array of memory macros for reducing the memory cycle time of a memory macro by 1/n comprising:
   an n by n memory array of memory macros having n macros arranged in columns and n macros arranged in rows;
   while writing data to a wordline having a wordline address, all the wordlines having the same wordline of address in macros in the same row are written with the same data, and data is written in an interleaved manner in which, after each 1/n of memory cycle time, data is written into another row of macros in another row of wordlines having the same wordline address.

10. The memory array of claim 9, wherein each macro comprises a memory selected from the group of semiconductor, magnetic and optical memories.

11. The memory array of in claim 9, wherein each macro comprises a memory selected from the group of DRAM, SRAM, Flash, NVRAM, and FRAM memories.

12. The memory array of claim 9, as a high-speed cache memory for a central processor unit.

13. The memory array of claim 9, as a high-speed cache memory for an embedded memory application.

14. The memory array of claim 9, further comprising a TAG memory to store the addresses of wordlines written with valid data in the memory array, wherein an incoming address is compared with the addresses stored in the TAG memory to schedule memory operations to minimize latency delays.

15. The memory of claim 9, further comprising a memory controller including at least one scheduler to schedule write operations.

16. The memory of claim 9, wherein while reading data from a wordline of the memory array, data is read from only one wordline from one macro of a column of macros, and after each 1/n of cycle time, data is read from only one another wordline of another macro of another column of macros.

17. A method for reducing the memory cycle time of a memory macro by 1/n comprising:
   providing an n by n memory array of memory macros having n macros arranged in columns and n macros arranged in rows;
   reading data from a wordline of the memory array, wherein data is read from only one wordline of one macro of the same row of macros, and after each 1/n of cycle time, data is read from only one another wordline of another macro of another row of macros.

18. The method of claim 17, including selecting each macro from the group of semiconductor, magnetic and optical memories.

19. The method of claim 17, including selecting each macro from the group of DRAM, SRAM, Flash, NVRAM, and FRAM memories.

20. The method of claim 17, including using the memory array as a high-speed cache memory for a central processor unit.

21. The method of claim 17, including using the memory as a high-speed cache memory for an embedded memory application.

22. The method of claim 17, further comprising using a TAG memory to store the addresses of wordlines written with valid data in the memory array, and comparing an incoming address with the addresses stored in the TAG memory to schedule memory operations to minimize latency delays.

23. The method of claim 17, further comprising scheduling read operations with a memory controller including at least one scheduler.

24. A method for reducing the memory cycle time of a memory macro by 1/n comprising:
   providing an n by n memory array of memory macros having n macros arranged in columns and n macros arranged in rows;
   writing data to a wordline having a wordline address, wherein all the wordlines having the same wordline of address in macros in the same row are written with the same data, and data is written in an interleaved manner in which, after each 1/n of memory cycle time, data is written into another row of macros in another row of wordlines having the same wordline address.

25. The method of claim 24, including selecting each macro from the group of semiconductor, magnetic and optical memories.

26. The method of claim 24, including selecting each macro from the group of DRAM, SRAM, Flash, NVRAM, and FRAM memories.

27. The method of claim 24, including using the memory array as a high-speed cache memory for a central processor unit.

28. The method of claim 24, including using the memory as a high-speed cache memory for an embedded memory application.

29. The method of claim 24, further comprising using a TAG memory to store the addresses of wordlines written with valid data in the memory array, and comparing an incoming address with the addresses stored in the TAG memory to schedule memory operations to minimize latency delays.

30. The method of claim 1, further comprising scheduling write operations with a memory controller including at least one scheduler.

31. A memory array of memory macros for reducing the memory cycle time of a memory macro by 1/n comprising:
  an n by n memory array of memory macros having n macros arranged in columns and n macros arranged in rows;
  while writing data to a wordline having a wordline address, all the wordlines having the same wordline of address in macros in the same row are written with the same data, and data is written in an interleaved manner in which, after each 1/n of memory cycle time, data is written into another row of macros in another row of wordlines having the same wordline address;
  while reading data from a wordline of the memory array, data is read from only one wordline from one macro of a column of macros, and after each 1/n of cycle time, data is read from only one another wordline of another macro of another column of macros.

32. A method for reducing the memory cycle time of a memory macro by 1/n comprising:
  providing an n by n memory array of memory macros having n macros arranged in columns and n macros arranged in rows;
  writing data to a wordline having a wordline address, wherein all the wordlines having the same wordline of address in macros in the same row are written with the same data, and data is written in an interleaved manner in which, after each 1/n of memory cycle time, data is written into another row of macros in another row of wordlines having the same wordline address;
  reading from a wordline of the memory array, wherein data is read from only one wordline of one macro of the same row of macros, and after each 1/n of cycle time, data is read from only one another wordline of another macro of another row of macros.

* * * * *

UNITED STATES PATENT AND TRADEMARK OFFICE
CERTIFICATE OF CORRECTION

PATENT NO. : 6,512,683 B2
DATED : January 28, 2003
INVENTOR(S) : Louis L. Hsu et al.

It is certified that error appears in the above-identified patent and that said Letters Patent is hereby corrected as shown below:

Column 4,
Line 48, "inthemarcros" should read -- in the macros --

Column 5,
Line 15, after "time" delete "."

Signed and Sealed this

Eighteenth Day of November, 2003

JAMES E. ROGAN
*Director of the United States Patent and Trademark Office*